(12) United States Patent
Placko et al.

(10) Patent No.: US 7,403,879 B2
(45) Date of Patent: Jul. 22, 2008

(54) METHOD OF EVALUATING A PHYSICAL QUANTITY REPRESENTATIVE OF AN INTERACTION BETWEEN A WAVE AND AN OBSTACLE

(75) Inventors: Dominique Marc Placko, Creteil (FR); Nicolas Liebeaux, Cachan (FR); Tribikram Kundu, Tucson, AZ (US)

(73) Assignees: Centre National de la Recherche Scientifique - CNRS, Paris (FR); Universite Paris SUD, Orsay (FR); University of Arizona, Tuscon, AZ (US)

( * ) Notice: Subject to any disclaimer, the term of this patent is extended or adjusted under 35 U.S.C. 154(b) by 0 days.

(21) Appl. No.: 10/533,680

(22) PCT Filed: Nov. 6, 2003

(86) PCT No.: PCT/FR03/03323

§ 371 (c)(1),
(2), (4) Date: May 3, 2005

(87) PCT Pub. No.: WO2004/044790

PCT Pub. Date: May 27, 2004

(65) Prior Publication Data

US 2006/0129342 A1    Jun. 15, 2006

(30) Foreign Application Priority Data

Nov. 12, 2002    (FR) .................................. 02 14108

(51) Int. Cl.
*G06F 7/60*    (2006.01)
*G09B 25/00*    (2006.01)

(52) U.S. Cl. ........................................... 703/2; 434/126

(58) Field of Classification Search ................... 703/2; 434/126
See application file for complete search history.

(56) References Cited

OTHER PUBLICATIONS

Dufour, Isabelle, and Dominique Placko. "An Original Approach to Eddy Current Problems Through a Complex Electrical Image Conept." IEEE Transactions on Magnetics, vol. 32, No. 2. Mar. 1996.*

Tsingos, Nicolas. "Geometrical Theory of Diffraction for Modeling Acoustics in Virtual Environments." SIGGRAPH 2001.*

Molecular Expressions Optical Microscopy Primer Physics of Light and Color "Interactive Java Tutorials: Reflection and Refraction with Huygens Wavelets." http://micro.magnet.fsu.edu/primer/java/reflection/huygens/index.html.*

Lim, Raymond "Acoustic scattering by a partially buried three-dimensional elastic obstacle." J. Acoust. Soc. Am. 104 (2) Pt. 1, Aug. 1998.*

(Continued)

*Primary Examiner*—Hugh Jones
(74) *Attorney, Agent, or Firm*—Marshall, Gerstein & Borun LLP

(57) ABSTRACT

The invention relates to the modelling of the interactions between an incident wave and an obstacle, in particular in the area of nondestructive testing. According to the invention, the surface of the obstacle is meshed and at least one source ($S_i$) is allocated to each surface element ($dS_i$). Boundary conditions are then calculated at each mesh cell of the obstacle and source values are deduced therefrom. On the basis of an interaction matrix and of these source values, a physical quantity representative of the interaction between the wave and the obstacle is estimated at any point of space.

29 Claims, 9 Drawing Sheets

OTHER PUBLICATIONS

Liebaux et al., "The distributed source method: a concept for open magnetic cores modeling"—European Physical Journal, Applied Physics, Nov. 2002, EDP Sciences, France, vol. 20, No. 2—Oct. 25, 2002—pp. 145-150, XP008021970 iSSN: 1286-0042. Retrieved from the Internet: URL: http://www.edpsciences.org/articles/epjap/pdf/2002/11/ap01142.pdf on Sep. 16, 2003.

Placko et al., "Theoretical Study of magnetic and ultrasonic sensors: dependence of magnetic potential and accoustic pressure on the sensor geometry"—Advanced Non destructive evaluation for structural and biological health monitoring, Newport Beach, CA, USA, Mar. 6-8, 2001. vol. 4335, pp. 52-62, XP 008021372—Proceedings of the SPIE—The International Society of Optical Engineering, 2001, USA—ISSN: 0277-786X.

Placko et al., "Theorietical computation of acoustic pressure generated by ultrasonic sensors in the presence of an interface". Smart Nondestructive evaluation for healtjh and biolgoical systems, Newport Beach, USA, Mar. 18-20, 2002, vol. 4702, Mar. 18, 2002—pp. 157-168, XP008021971—Proceedings of the SPIE—The International Society of Optical Engineering, 2002, USA—ISSN: 0277-786X.

International Search Report, PCT/FR 03/03323; report dated Mar. 25, 2004.

* cited by examiner

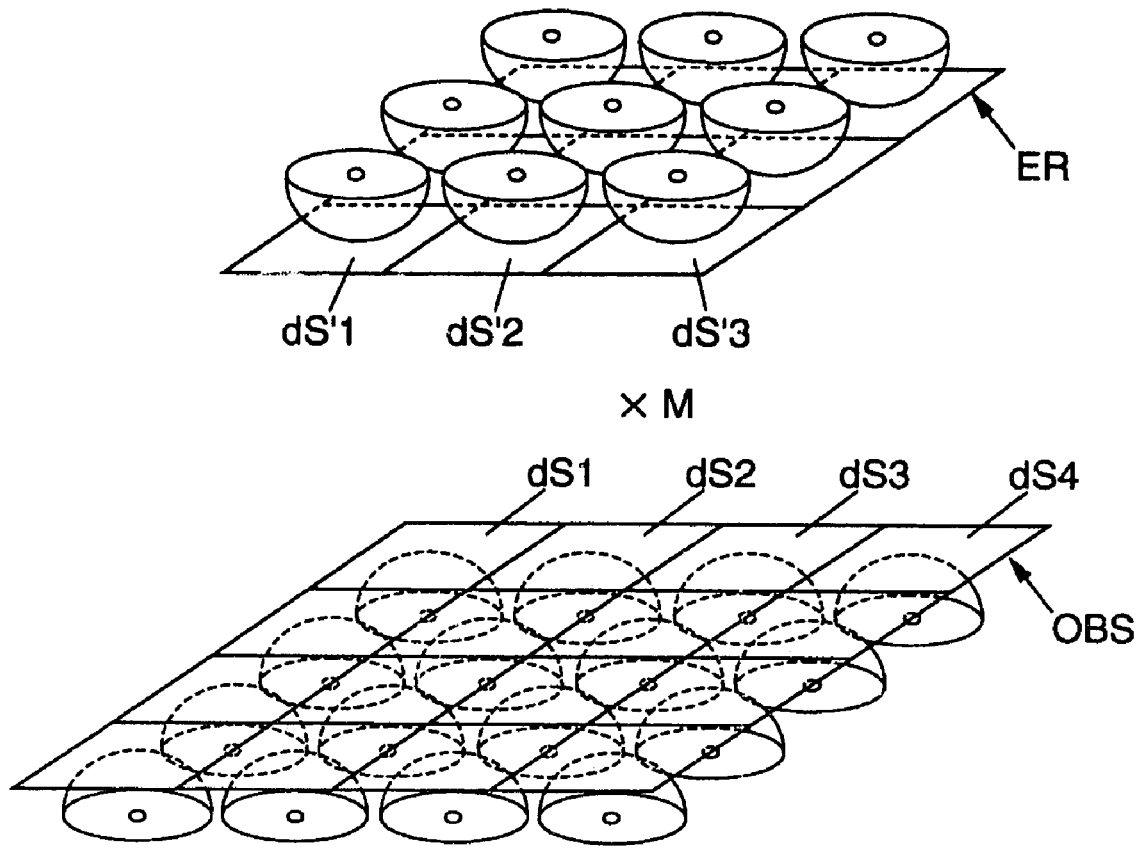
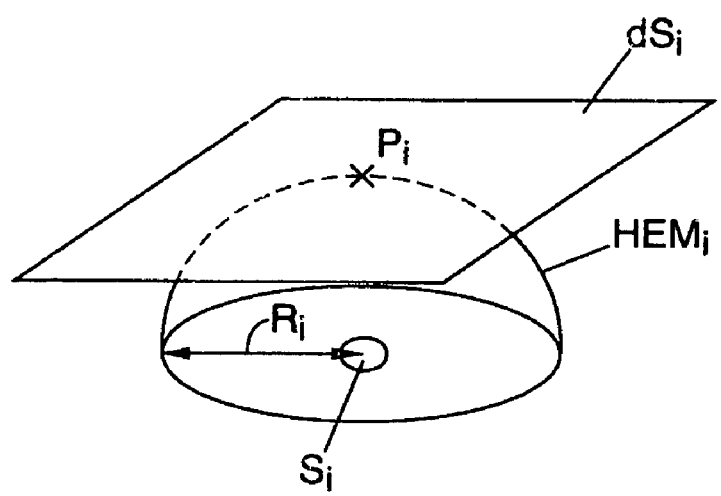
FIG. 1A
FIG. 1B

METHOD OF EVALUATING A PHYSICAL QUANTITY REPRESENTATIVE OF AN INTERACTION BETWEEN A WAVE AND AN OBSTACLE

FIELD OF THE INVENTION

The invention relates to the modelling of the interactions between an incident wave and an obstacle of this wave, in particular in the area of nondestructive testing.

BACKGROUND OF THE INVENTION

The modelling of the interactions between a wave and an obstacle receiving this wave, such as a target placed in the responsive zone of a sensor, finds an advantageous application in nondestructive testing.

A method of modelling called "finite elements" is known consisting in applying a tiling of the three-dimensional space surrounding the obstacle and in evaluating the aforesaid interactions for all the tiles of the space.

Methods of computation by "finite elements" afford a solution to a problem posed in the form of partial differential equations. They are based on a representation of the space under study by an assemblage of finite elements, inside which are defined approximation functions determined in terms of nodal values of the physical quantity sought. The continuous physical problem therefore becomes a discrete finite element problem where the nodal quantities are the new unknowns. Such methods therefore seek to approximate the global solution, rather than the starting equations in the partial spatial derivatives.

The discretization of the space taken into account ensures that the latter is entirely covered by finite elements (lines, surfaces or volumes), this operation is called "meshing" in two dimensional space (2D) or "tiling" in three-dimensional space (3D). The elements involved are either rectangular or triangular in 2D, or parallelepipedal or tetrahedral in 3D. They may be of different sizes, distributed uniformly or otherwise over the surface.

In general, the physical quantity sought, such as an electrostatic potential or a pressure value, is known on the boundary of the domain. This boundary may be fictitious. Boundary conditions are imposed there. The potential is therefore unknown inside the same domain. A node is then defined as being a vertex of an element. The unknowns of the problem are therefore the values of the potential at each node of the domain as a whole.

By way of illustration, FIG. 6 of the prior art represents an exemplary surface, consisting of two materials M1 and M2, of different electromagnetic properties, and meshed by triangular elements each comprising three nodes Ai, Bi and Ci. The domain as a whole is delimited by a boundary F.

Once the mesh has been defined, several approaches exist for transforming the physical formulation of the problem into a discrete modelling by finite elements. If the problem is formulated through differential equations and consists in minimizing a functional, then a variational procedure is generally applied. This transformation leads to a matrix formulation which when solved gives the nodal solutions, the solutions at the non-nodal points being obtained by linear interpolation.

Nevertheless, such computations, in three dimensions, require considerable computing resources and generate very long computation times, despite the enhancement in the performance of software allowing the implementation of these computations.

Admittedly, 2D problems, often simplified by symmetry conditions that are advantageous for modelling only part of the geometry, are solved rapidly. However, this is not so for 3D problems, which are the most frequent. FIG. 6 shows how the fineness of the mesh, that is to say the ratio of the size of an element to that of the smallest detail of the domain, amplifies the number of nodes.

Consequently, the number of equations and of unknowns increases proportionally, and, hence, the computation time required for solving the problem. It is important to point out that the generation of the mesh, namely the discretization of the workspace, and the generation of the list of nodes consumes greater computation time than that required for solving the problem.

The present invention aims to improve the situation.

SUMMARY OF THE INVENTION

Accordingly it proposes a method of evaluating a physical quantity associated with an interaction between a wave and an obstacle, in a region of three-dimensional space, in which:

a) a plurality of surface samples, of which a part at least represents the surface of an obstacle receiving a main wave and emitting, in response, a secondary wave, is determined by meshing, and at least one source emitting an elementary wave representing a contribution to the said secondary wave is allocated to each surface sample, b) a matrix system is formed, comprising:
   an invertible interaction matrix, applied to a given region of space and comprising a number of columns corresponding to a total number of sources,
   a first column matrix, each coefficient of which is associated with a source and characterizes the elementary wave that it emits,
   and a second column matrix, which is obtained by multiplication of the first column matrix by the interaction matrix and the coefficients of which are values of a physical quantity representative of the wave emitted by the set of sources in the said given region, c) to estimate the coefficients of the first column matrix, chosen values of physical quantity are assigned to predetermined points, each associated with a surface sample, the said chosen values being placed in the second column matrix, and this second column matrix is multiplied by the inverse of the interaction matrix applied to the said predetermined points, d) to evaluate the said physical quantity representing the wave emitted by the set of sources in a given region of three-dimensional space, the interaction matrix is applied to the said given region and this interaction matrix is multiplied by the first column matrix comprising the coefficients estimated in step c).

Thus, according to one of the advantages afforded by the present invention, the meshing step a) relates only to one or more surfaces, whereas the method of modelling of the "finite element" type requires a tiling of the whole space neighboring the obstacle, thereby making it possibly to reduce, in the implementation of the method according to the invention, the memory resources and the computation times required.

The method according to the invention applies equally well to a main wave emitted by a far source as to a main wave emitted in the near field.

Advantageously, to evaluate a physical quantity representative of an interaction between an element radiating a main wave and an obstacle receiving this main wave, in step a), a plurality of surface samples together representing an active surface of the element radiating the main wave is furthermore determined, by meshing, and at least one source emitting an elementary wave representing a contribution to the said main wave is allocated to each sample of the active surface, steps b), c) and d) are applied to the samples of the active surface, and the said physical quantity representing the interaction between the radiating element and the obstacle in a given region of three-dimensional space is evaluated by taking account of the contribution, in the said given region, of the main wave emitted by the set of sources of the active surface and the contribution of the secondary wave emitted by the set of sources of the surface of the obstacles.

The terms "radiating element" are understood to mean either an emitter of the main wave, such as a wave generator, or a receiver of the main wave, such as a sensor of this wave.

In a first embodiment, the physical quantity to be evaluated is a scalar quantity and, in step a), a single source is allocated to each surface sample.

In a second embodiment, the physical quantity to be evaluated is a vector quantity expressed by its three coordinates in three-dimensional space, and three sources are allocated, in step a), to each surface sample.

In an advantageous embodiment, to estimate, in step d), the contribution of the secondary wave in the given region of space, the values of physical quantity chosen in step c) are dependent on a predetermined coefficient of reflection and/or of transmission of the main wave by each surface sample of the obstacle.

Thus, it will be understood that the secondary wave may either correspond to a reflection of the main wave, or to a transmission of the main wave, or else to a diffraction of the main wave. In this advantageous embodiment, step c) corresponds finally to a determination of the boundary conditions at the surface of the obstacle, in the guise of interface between two distinct media in particular in a heterostructure.

Furthermore, for nondestructive testing of a target forming an obstacle of a main wave, a chosen coefficient of reflection or of transmission is allocated to all the predetermined points of the surface of the target, and a simulation obtained by the implementation of the method within the meaning of the invention is compared with an experimental measurement. Thus, the points of the surface of the target which, in the experimental measurement, do not satisfy the simulation correspond to inhomogeneities or to impurities on the surface of the target.

In another approach, the global properties of the obstacle are known, in particular in transmission and/or in reflection. By the implementation of the method of the invention, the position in space of a sensor or even the shape of this sensor is then optimized for application to nondestructive testing, this sensor being intended to analyse a target forming an obstacle of the main wave.

Accordingly, in an advantageous embodiment, a plurality of values of the physical quantity estimated in step d) within the meaning of the method of the invention, which are obtained for a plurality of regions of space, are compared so as to select a candidate region for the placement of a radiating element intended to interact with the obstacle.

As indicated hereinabove, the terms "radiating element" are understood to mean either a sensor or a generator of the wave. It will thus be understood that the optimization of the position of the radiating element can be applied also to the optimization of the placement or of the shape of a wave generator. For example, the present invention also finds an advantageous application to the placement of loudspeakers in a closed volume, delimited by obstacles, such as for example the cabin of a motor vehicle.

BRIEF DESCRIPTION OF THE DRAWINGS

Other characteristics and advantages of the invention will become apparent on examining the detailed description hereinbelow, and the appended drawings in which:

FIG. 1A diagrammatically represents the respective surfaces of a radiating element ER emitting a wave and of an obstacle OBS receiving this wave, said surfaces being meshed with a view to evaluating a scalar quantity representative of the wave at a point M of three-dimensional space;

FIG. 1B represents in detail a surface sample $dS_i$ corresponding to a mesh cell of FIG. 1A, as well as a source $S_i$ associated with the surface sample $dS_i$;

MORE DETAILED DESCRIPTION

Figure 2A:
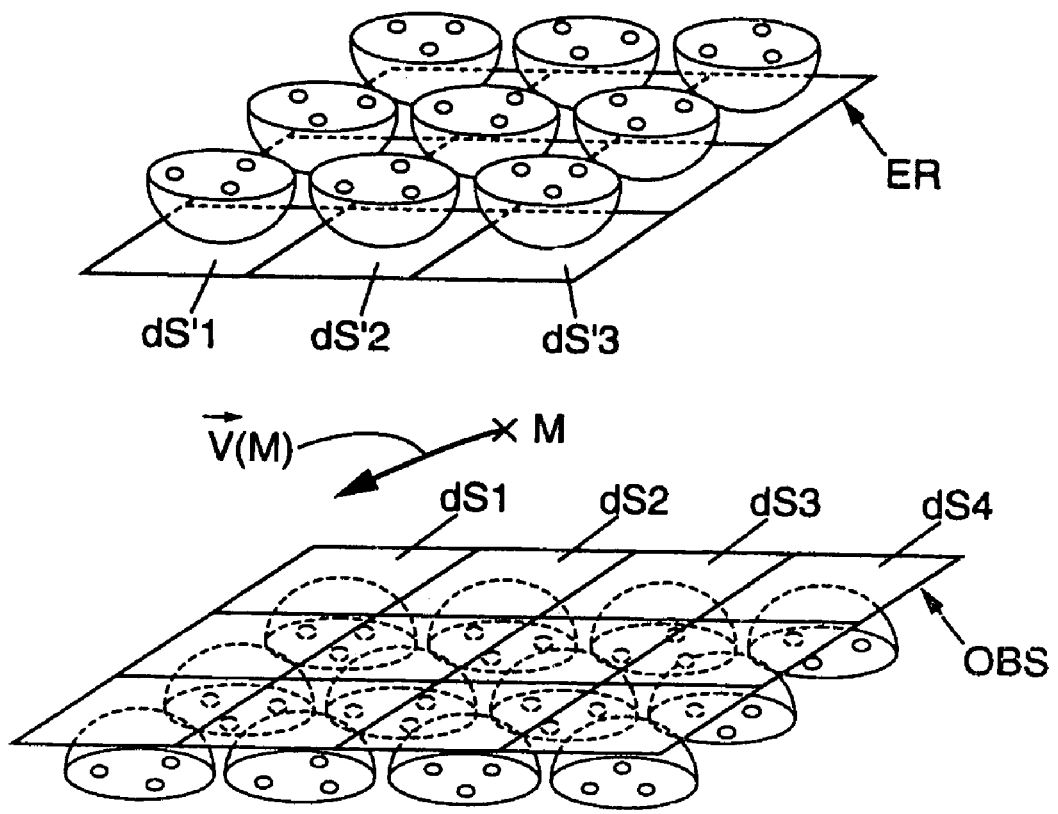
FIG. 2A diagrammatically represents the respective surfaces of a radiating element ER emitting a wave and of an obstacle OBS receiving this wave, said surfaces being meshed with a view to evaluating a vector quantity representative of the wave at a point M of three-dimensional space.

Reference is first made to FIG. 1A, in which the surface of an obstacle OBS, receiving a wave, is meshed according to a plurality of surface samples $dS_1$ to $dS_4$, in accordance with the aforesaid step a).

Referring to FIG. 1B, with each surface sample $dS_i$ is associated a hemisphere $HEM_i$, tangential to the surface sample $dS_i$ at a point of contact $P_i$. Preferably, this point of contact $P_i$ corresponds to the apex of the hemisphere $HEM_i$. For the estimation of a scalar physical quantity at the point M (such as an electrostatic potential, an acoustic pressure or the like), a single source $S_i$ is associated with the surface sample $dS_i$. As will be seen later, in the case of the estimation of a vector quantity in a point of space M, three sources will rather be assigned to each surface sample $dS_i$.

Preferably, the hemisphere $HEM_i$ is constructed as described hereinbelow. During the aforesaid meshing step a), the surface area of the obstacle OBS is on the one hand evaluated, and, on the other hand, a number of surface samples $dS_i$ is chosen according to the desired accuracy of estimation of the physical quantity at the point M. Thus, the surface area of a sample $dS_i$ is given by $S_o/N$, where $S_o$ corresponds to the total surface area of the obstacle and N corresponds to the chosen number of surface samples $dS_i$.

The hemisphere $HEM_i$ has the same surface area as the sample $dS_i$. Thus, the radius $R_i$ of the hemisphere is deduced from the expression:

$$2\pi R_i^2 = \frac{S_o}{N}$$

Each mesh cell represented by a surface sample $dS_i$ exhibits, in the example described, a parallelogram shape, whose centre $P_i$ corresponds to the point of intersection of the diagonals of this parallelogram. The hemisphere $HEM_i$ is tangential to the surface sample $dS_i$ at this point $P_i$. Of course, the mesh cells may be of different shape, triangular or other. It is indicated generally that the point $P_i$ corresponds to the barycentre of the mesh cell.

The position of the source $S_i$ (situated at the centre of the hemisphere $HEM_i$) is thus defined. The distance separating the source $S_i$ from the point of contact $P_i$ corresponds to the radius $R_i$ of the hemisphere $HEM_i$ and the straight line which passes through the points $P_i$ and $S_i$ is orthogonal to the mesh cell $dS_i$.

In the example represented in FIG. 1A, the surface of a radiating element ER, corresponding for example to a wave generator, is furthermore meshed. With each mesh cell of the surface of the radiating element is associated a surface sample $dS'_i$, as will be seen later.

The matrix system that is formulated in the aforesaid step b) corresponds to:

$$\begin{pmatrix} V(M_1) \\ V(M_2) \\ \vdots \\ V(M_N) \end{pmatrix} = F \times \begin{pmatrix} v_1 \\ v_2 \\ \vdots \\ v_N \end{pmatrix} \quad [1]$$

where:
the coefficients $v_j$ (with j=1, 2, . . . , N) of the first column matrix correspond to values each associated with a source, such as an electric charge (in the case of the estimation of an electric potential), or to a magnetic flux (in the case of the estimation of a magnetic potential), or else to a sound speed (in the case of the estimation of an acoustic pressure related to the propagation of a sound wave);

the coefficients $V(M_i)$ (with i=1, 2, . . . , N) of the second column matrix each correspond to a value of the physical quantity (an electric or magnetic potential or a pressure) to be estimated at a point $M_i$ of space);

the interaction matrix F comprises coefficients $C_{i,j}$, the general expression for which is given by:

$$C_{i,j} = f(M_i S_j) \quad [2]$$

It is thus understood that the coefficients of the matrix F are interaction coefficients which depend on the distance separating each point of the space $M_i$ from a source $S_j$ associated with a mesh cell $dS_j$.

In the case of the propagation of an electric wave, the coefficients $c_{i,j}$, $v_j$ and $V(M_i)$, respectively of the interaction matrix of the first and of the second column matrix, are given by:

$$C_{i,j} = \frac{1}{2\pi\varepsilon_0 \overline{M_i S_j}} \quad [3]$$

$$v_j = q_j$$

$$V(M_i) = U_i$$

where:
$\varepsilon_0$ is a dielectric constant,
$\overline{M_i S_j}$ is a distance measured as an algebraic value,
$q_j$ corresponds to an electric charge characterizing a source $S_j$, and
$U_i$ corresponds to an electric potential at the point $M_i$.

In the case of the propagation of a magnetic wave, the expression for these coefficients is as follows:

$$C_{i,j} = \frac{1}{2\pi\mu_0 \overline{M_i S_j}} \quad [4]$$

$$v_j = \varphi_j$$

$$V(M_i) = \theta_i$$

where:
$\mu_0$ corresponds to the magnetic permeability of the medium where the point $M_i$ is situated,
$\varphi_j$ corresponds to the magnetic flux associated with the source $S_j$;
$\theta_i$ corresponds to the magnetic potential at the point $M_i$.

Within the framework of the propagation of an ultrasound wave, these coefficients are given by:

$$C_{i,j} = -\frac{i\omega\rho}{2\pi} \frac{\exp(\vec{ik} \cdot \overrightarrow{M_i S_j})}{\overline{M_i S_j}} \cdot dS_j \qquad [5]$$

$$v_j = \vec{v_j}$$

$$V(M_i) = p_i$$

in which:

$i^2 = -1$.

$\omega$ is the angular frequency of the sound wave;

$\rho$ is the density of the medium in which the point $M_i$ is situated;

the vector $\vec{v}_j$ corresponds to the sound speed emanating from the source $S_j$;

$\vec{k}$ corresponds to the wave vector of the sound wave; and $p_i$ corresponds to the acoustic pressure generated by the propagation of the ultrasound wave at the point $M_i$.

In the expression for the coefficients $c_{i,j}$, the term $dS_j$ corresponds to the surface area of the sample associated with the source $S_j$. Preferably, the meshing of a surface within the meaning of step a) of the method according to the invention is chosen in such a way that each mesh cell comprises one and the same surface area $dS = dS_1 = dS_2 = \ldots = dS_j$.

Figure 4A:
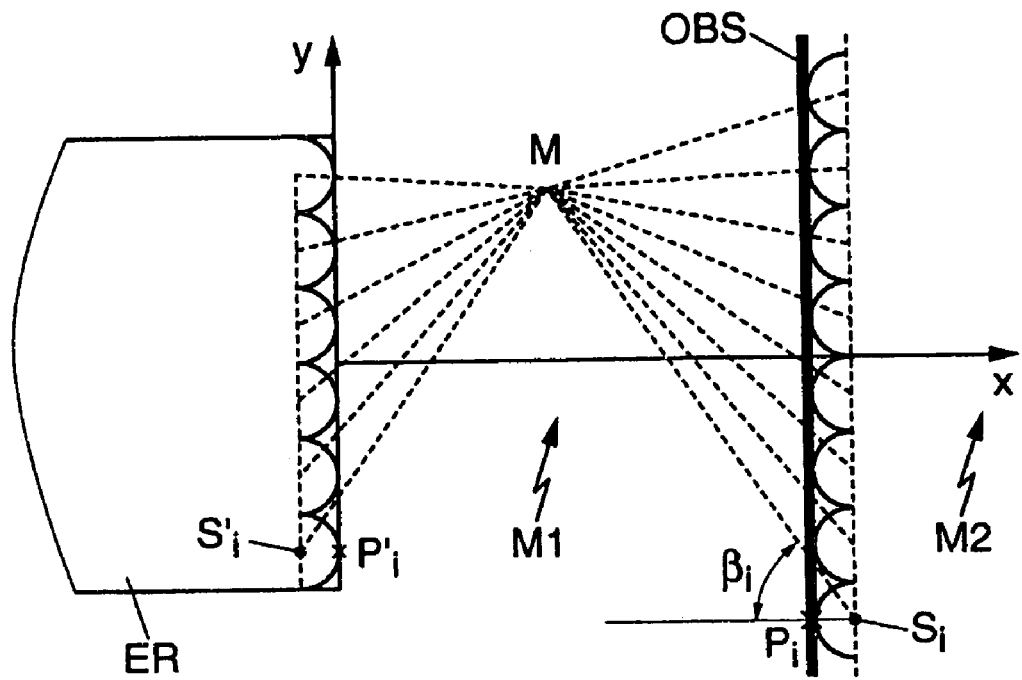
FIG. 4A represents, like FIGS. 1A and 2A, an interaction between a radiating element ER and an obstacle OBS, so as to evaluate a physical quantity (scalar or vector) at a point M in a portion of space delimited by the surface of the radiating element and the surface of the obstacle, this point of space M receiving both the wave emitted by the radiating element and the wave reflected by the obstacle.

It is noted in particular in the expression for the coefficients $c_{i,j}$ that they depend on the scalar product of the wave vector and the vector $\overrightarrow{M_i S_j}$. Thus, for ultrasound waves, account is taken of a phase shift between the paths which join each source $S_j$ to a point of three-dimensional space M, this phase shift being due to a difference in journey length between the rays leaving each source and arriving at the point M (as shown in FIG. 4A). In particular, it will be understood that the angle of incidence of such a ray is taken into account in the expression for the coefficients of the interaction matrix F.

Of course, within the framework of the propagation of an electromagnetic wave of high frequency, hence of short wavelength, which differs from the electrostatic or magnetostatic framework hereinabove, account is taken of the propagation term $\exp(i\vec{k} \cdot \vec{r})$ in the expression for the interaction matrix, with respect to the geometry of the problem to be solved, as within the framework of the propagation of an ultrasound wave hereinabove (relation [5]).

Thus, the matrix system of equation [1] makes it possible to estimate, on the basis of an interaction matrix F and of a vector comprising the values $v_j$ associated with the sources $S_j$, the coefficients of a vector (column matrix) comprising the values of physical quantity $V(M_i)$ at the points of space $M_i$.

To determine the values of the sources $v_j$, the following matrix system is applied:

$$\begin{pmatrix} V(P_1) \\ V(P_2) \\ \vdots \\ V(P_N) \end{pmatrix} = F \times \begin{pmatrix} v_1 \\ v_2 \\ \vdots \\ v_N \end{pmatrix} \qquad [6]$$

where:

the coefficients of the interaction matrix F are expressed by with $C_{i,j} = f(P_i S_j)$ the indices i and j correspond respectively to the $i^{th}$ row and the $j^{th}$ column of the interaction matrix F. This interaction matrix comprises, for the determination of the values associated with the sources $v_j$, N rows and N columns, recalling that N is the total number of mesh cells on the surface of the obstacle;

the points $P_i$ correspond to the apex of the hemispheres $HEM_i$ of FIG. 1B.

The implementation of step c) of the method within the meaning of the present invention corresponds to computing a boundary condition for the points $P_i$, of known properties, as will be seen later.

The matrix system of equation [6] then becomes:

$$\begin{pmatrix} v_1 \\ v_2 \\ \vdots \\ v_N \end{pmatrix} = F^{-1} \times \begin{pmatrix} V(P_1) \\ V(P_2) \\ \vdots \\ V(P_N) \end{pmatrix} \qquad [7]$$

where:

$F^{-1}$ corresponds to the inverse of the interaction matrix F; and the values $V(P_i)$ are predetermined, as a function of the aforesaid boundary conditions.

The source values $v_j$ are thus determined.

On the basis of the estimation of these source values $v_j$, it is possible to compute the scalar physical quantity at any point M of three-dimensional space, on the basis of the relation:

$$V(M) = \sum_{j=1}^{N} f(MS_j) \cdot v_j \qquad [8]$$

To obtain this expression for the scalar quantity V(M), the interaction matrix F may comprise just one row of coefficients $c_j$, with:

$$c_j = f(MS_j),$$

but always comprises N columns.

Referring again to FIG. 1A, it will be understood that the surface of the obstacle OBS receiving the wave emitted by the radiating element ER acts, itself, as an active surface re-emitting a secondary wave (for example by reflection). Each source $S_i$ represents a contribution to the emission of this secondary wave.

Furthermore, to take account both of the presence of the main wave and of the presence of the secondary wave at the point M, the contribution of the main wave and the contribution of the secondary wave at the point M are estimated via the matrix system:

$$V(M) = F \times \begin{pmatrix} v_1 \\ v_2 \\ \vdots \\ v_N \end{pmatrix} + F' \times \begin{pmatrix} v'_1 \\ v'_2 \\ \vdots \\ v'_{N'} \end{pmatrix} \qquad [9]$$

where:

F' is the matrix of interaction between the surface of the radiating element and the point M;

$v'_j$ (with j=1, 2, 3, ..., N') is the value of the sources allocated to each surface sample $dS'_j$ of the radiating element, N' being the chosen total number of mesh cells of the active surface of the radiating element ER.

The coefficients of the matrix F' are again dependent on the distance $MS'_j$, where $S'_j$ are the sources assigned to each surface sample $dS'_j$ of the radiating element.

According to an advantageous characteristic, the values of the sources of the obstacle $v_j$ are determined as a function of the values of the sources of the radiating element $v'_j$, and which are themselves computed as will be seen later with reference to FIGS. 4A, 4B, 5A and 5B.

Reference is now made to FIG. 2A, in which three sources are assigned to each surface sample $dS_i$, with a view to estimating a vector physical quantity $\vec{V(M)}$, at a point M of three-dimensional space.

It will be understood that to estimate the vector quantity, via its three coordinates in space x, y and z, the number of equations to be solved with respect to the previous matrix system must be multiplied by three. Thus, the matrix $F^{-1}$ of relation [7] must comprise three times as many rows as before. The interaction matrix F must, itself, comprise three times as many columns as before and, accordingly, three sources are advantageously envisaged per mesh cell when dealing with the determination of the coordinates in three-dimensional space of a vector $\vec{V(M)}$.

Figure 2B:
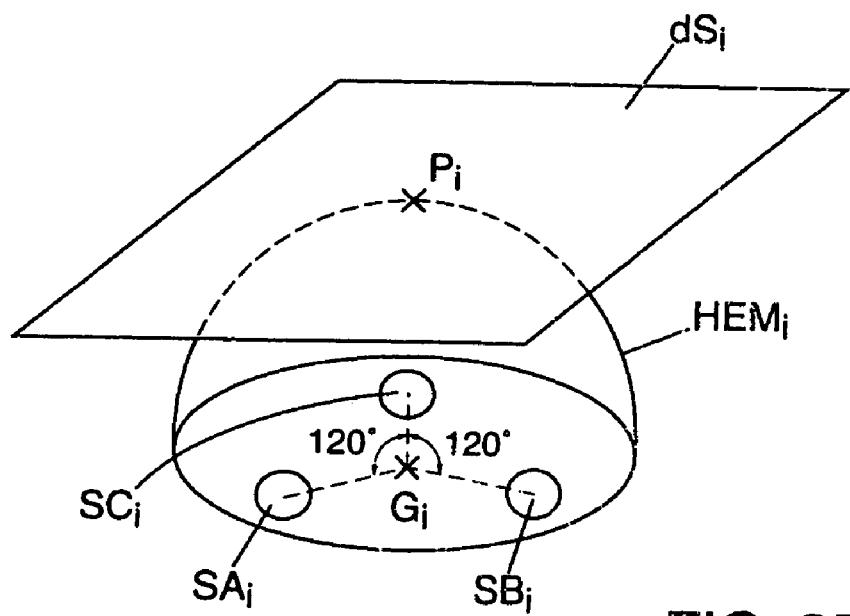
FIG. 2B represents in detail a surface sample $dS_i$ corresponding to a mesh cell of FIG. 2A, as well as three associated sources $SA_i$, $SB_i$ and $SC_i$.

Referring to FIG. 2B, the three sources $SA_i$, $SB_i$, $SC_i$, allocated to a surface sample $dS_i$ have respective positions determined as is indicated hereinbelow. Such as represented in FIG. 2B, the three sources $SA_i$, $SB_i$, $SC_i$ are coplanar and the plane which includes these three sources also includes the base of the hemisphere $HEM_i$. The hemisphere $HEM_i$ is constructed as indicated hereinabove (with the same surface area as the surface area of the mesh cell), with however the centre of the hemisphere which corresponds here to the barycentre of the three sources $SA_i$, $SB_i$ and $SC_i$.

The "centre of the hemisphere" is understood to mean the centre of the disk which constitutes the base of the hemisphere.

The three sources which are allocated to the surface sample $dS_i$ are placed at the vertices of an equilateral triangle whose barycentre $G_i$ corresponds to the centre of the hemisphere. Preferably, each source $SA_i$, $SB_i$ and $SC_i$ is placed in the middle of a radius $R_i$ of the hemisphere. Thus, the straight lines which connect the barycentre $G_i$ to each source are angularly separated by 120°.

Figure 2C:
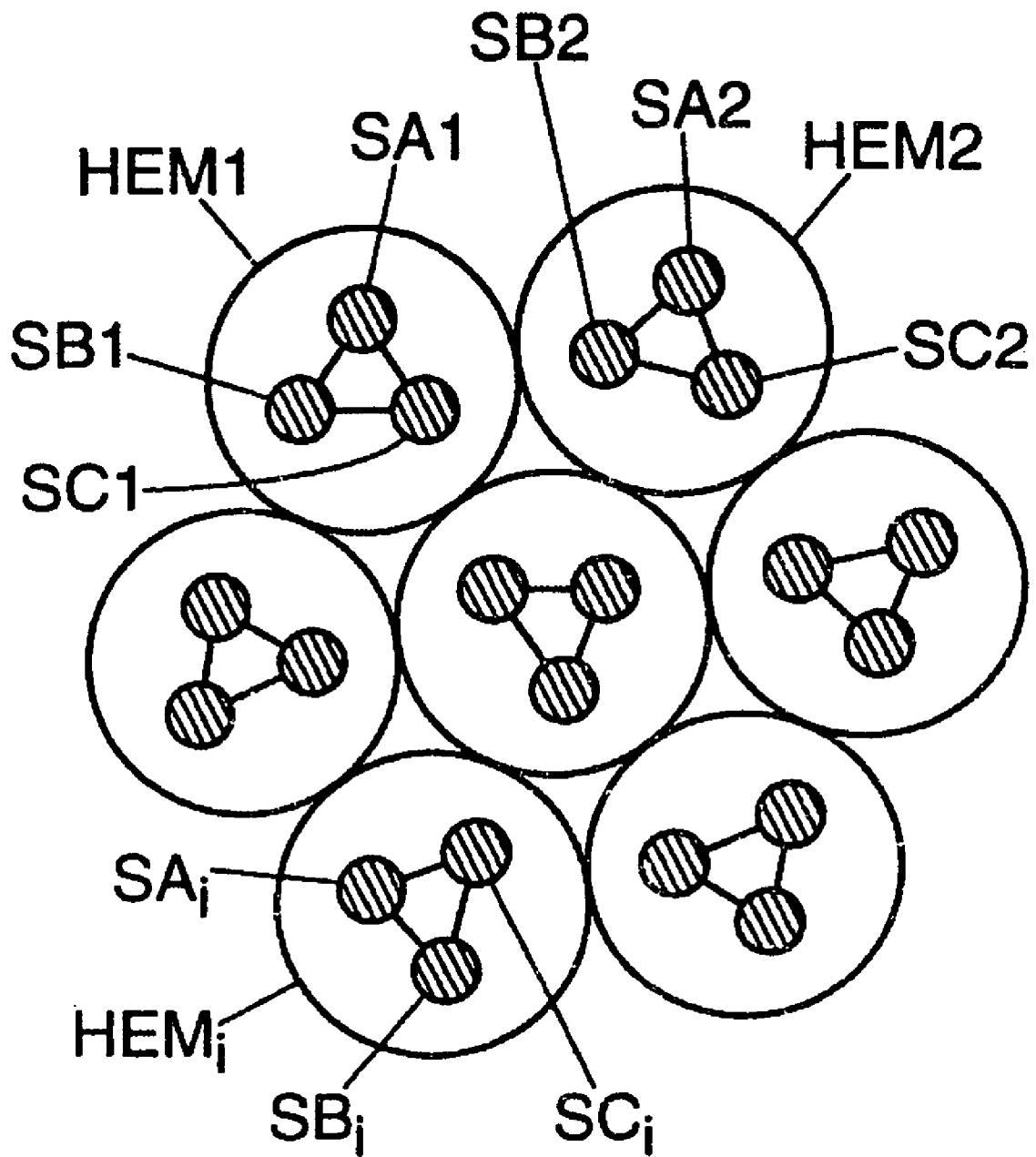
FIG. 2C represents, viewed face on, a meshed surface, each surface sample of which comprises three sources $SA_i$, $SB_i$ and $SC_i$, for the estimation of a vector quantity.

Referring to FIG. 2C, the angular orientation of the triangles formed by the triplets of sources is chosen randomly, from one surface sample to another. Advantageously, overperiodicity artefacts, which could result from the choosing of one and the same angular orientation of these triangles, are thus avoided in the estimation of the vector quantity at the point M.

With reference to the various wave types indicated previously, the vector quantity $\vec{V}(M)$ to be estimated may be:
- an electric field, within the framework of the propagation of an electric wave;
- a magnetic field, within the framework of the propagation of a magnetic wave; and
- a speed of sound at the point M, within the framework of the propagation of ultrasound waves.

To determine the values associated with each source $SA_i$, $SB_i$, $SC_i$, the matrix system is formulated according to the following relation:

$$\begin{pmatrix} V_x(P_1) \\ V_x(P_2) \\ \vdots \\ V_x(P_N) \\ V_y(P_1) \\ V_y(P_2) \\ \vdots \\ V_y(P_N) \\ V_z(P_1) \\ V_z(P_2) \\ \vdots \\ V_z(P_N) \end{pmatrix} = F_{\vec{V}} \times \begin{pmatrix} vA_1 \\ vA_2 \\ \vdots \\ vA_N \\ vB_1 \\ vB_2 \\ \vdots \\ vB_N \\ vC_1 \\ vC_2 \\ \vdots \\ vC_N \end{pmatrix} \quad [11]$$

It is noted, in particular, that the interaction matrix $F\vec{V}$ is of dimensions 3N×3N, where N is the total number of surface samples. The interaction matrix is expressed here through the relation:

$$F_{\vec{V}} = \begin{pmatrix} N\{C_A^x(i,j) & C_B^x(i,j) & C_C^x(i,j) \\ N\{C_A^y(i,j) & C_B^y(i,j) & C_C^y(i,j) \\ N\{C_A^z(i,j) & C_B^z(i,j) & C_C^z(i,j) \end{pmatrix} \quad [12]$$

The coefficients of this matrix are expressed through:

$$C_\sigma^u(i,j) = f_u[d(P_i, S\sigma_j)] \quad [13]$$

with σ=A, B, C
i=1, 2, ..., N
j=1, 2, ..., N
u=x, y, z.

and are also dependent on a distance separating the point of contact $P_i$ from one of the sources $S\sigma_j$ (σ=A, B or C) of a triplet associated with a surface sample $dS_j$.

By inverting the interaction matrix $F_{\vec{V}}$, the values $v\sigma_j$ associated with each source $S\sigma_j$ are thus determined by applying boundary conditions on the values of the vector $\vec{V}$ at the points $P_i$. These boundary conditions impose a value of the vector $\vec{V}$, according to its three coordinates $V_x(P_i)$, $V_y(P_i)$ and $V_z(P_i)$.

Once these source values $v\sigma_j$ have thus been determined, the expression for the vector $\vec{V}$ at any point M of space can easily be computed through the relation:

$$\vec{V}(M) = V_x(M)\vec{x} + V_y(M)\vec{y} + V_z(M)\vec{z} \quad [14]$$

$$V_x(M) = \sum_{\substack{j=1,\ldots,N \\ \sigma=A,B,C}} f_x[(d(M, S\sigma_j))] \cdot v\sigma_j$$

$$V_y(M) = \sum_{\substack{j=1,\ldots,N \\ \sigma=A,B,C}} f_y[(d(M, S\sigma_j))] \cdot v\sigma_j$$

$$V_z(M) = \sum_{\substack{j=1,\ldots,N \\ \sigma=A,B,C}} f_z[(d(M, S\sigma_j))] \cdot v\sigma_j$$

$\vec{x}$, $\vec{y}$ and $\vec{z}$ correspond to unit vectors plotted along the axes x, y and z of three-dimensional space.

Thus, the interaction matrix $F_{\vec{V}}$, when it is applied to any point M of space, ultimately comprises only three rows each associated with a coordinate of space x, y or z.

For various types of waves, the values of the sources $v\sigma_j$ are, as before, an electric charge in respect of an electric wave, a magnetic flux in respect of a magnetic wave, a speed of sound in respect of an ultrasound wave.

More precisely, the coefficients of the interaction matrix F $\vec{v}$ are determined from the above relations [3], [4] and [5], specifying however that:

$$\vec{V}(M) = -\overline{\text{grad}}[V(M)] \quad [15]$$

V(M) being the scalar quantity computed previously through equation [8].

Thus, for the estimation of a vector quantity $\vec{V}$ at the point M and for the wave types mentioned above by way of example (electric, magnetic and ultrasound), the coefficients of the interaction matrix $F_{\vec{V}}$ are inversely proportional to the square of a distance separating each source from the point M, while for the estimation of a scalar quantity V at a point M of space, the coefficients of the interaction matrix F are simply inversely proportional to this distance. Each distance involves one of the sources of a triplet of a surface sample and a point M of space. The interaction matrix $F_{\vec{V}}$ then comprises 3N columns when taking three sources per surface sample, while the interaction matrix F for the estimation of the scalar quantity comprised only N columns since just one source per surface sample was necessary.

More generally, one source per sample is allocated when boundary conditions are known for a scalar quantity and three sources per sample are allocated when boundary conditions are in fact known for a vector quantity.

Figure 3A:
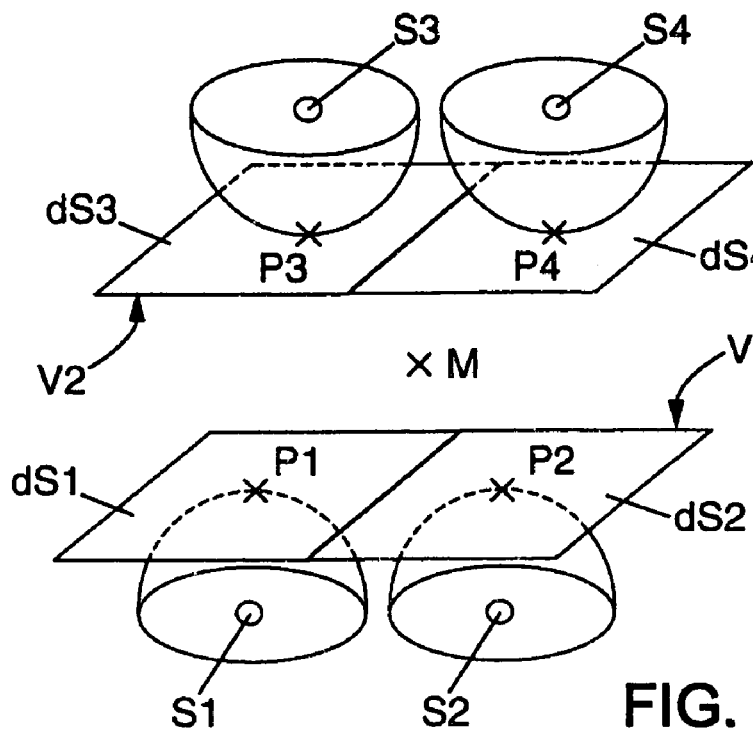
FIG. 3A represents, by way of illustration, the plates of a capacitor, of respective electric potentials V1 and V2, for the estimation of an electric potential at the point M of three-dimensional space, a single source $S_i$ being associated with each surface sample $dS_i$ of FIG. 3A.

Reference is now made to FIG. 3A to describe, by way of illustration, an application of the method according to the invention to the estimation of an electric potential at a point M of three-dimensional space, situated between two plates of a capacitor. The plates of this capacitor are brought to respective potentials V1 and V2. The implementation of step a) consists firstly in meshing the respective surfaces of the two plates. In the example represented in FIG. 3A, only two mesh cells have been represented for each plate, simply by way of illustration.

The application of step b) consists in formulating the matrix system involving the interaction matrix F and the column vector comprising the values of the sources $S_1$ to $S_4$. Multiplication of these two matrices makes it possible to obtain a column vector comprising the values of the potential at one or more points M of space.

The implementation of step c) of the method according to the invention consists in applying the matrix system to the points of contact of the hemispheres $P_1$ to $P_4$, of each surface sample $dS_1$ to $dS_4$. This results in the following relation:

$$\begin{pmatrix} V(P_1) \\ V(P_2) \\ V(P_3) \\ V(P_4) \end{pmatrix} = \frac{1}{2\pi\varepsilon_0} \begin{pmatrix} \frac{1}{P_1 S_1} & \frac{1}{P_1 S_2} & \frac{1}{P_1 S_3} & \frac{1}{P_1 S_4} \\ \frac{1}{P_2 S_1} & \frac{1}{P_2 S_2} & \frac{1}{P_2 S_3} & \frac{1}{P_2 S_4} \\ \frac{1}{P_3 S_1} & \frac{1}{P_3 S_{21}} & \frac{1}{P_3 S_3} & \frac{1}{P_3 S_4} \\ \frac{1}{P_4 S_1} & \frac{1}{P_4 S_2} & \frac{1}{P_4 S_3} & \frac{1}{P_4 S_4} \end{pmatrix} \begin{pmatrix} v_1 \\ v_2 \\ v_3 \\ v_4 \end{pmatrix} \quad [16]$$

with $V(P_1) = V(P_2) = V_1$ $V(P_3) = V(P_4) = V_2$ $v_1 = q_1$, $v_2 = q_2$, $v_3 = q_3$, $v_4 = q_4$ Here, the boundary condition prescribes that the value of the potential at the points of contact $P_1$ and $P_2$ should correspond to the potential V1 of the first plate. Likewise, the electric potential at the points of contact $P_3$ and $P_4$ should correspond to the electric potential of the second plate V2. By inverting the interaction matrix applied to the point of contact $P_i$, the values of the sources $v_i$ which correspond, as expressed in relation [16], to electric charges $q_i$ are determined.

The coefficients of the interaction matrix $$\frac{1}{2\pi\varepsilon_0 P_i S_j}$$

are known perfectly, since the positions of the sources $S_j$ and the positions of the points of contact $P_i$ are determined beforehand, as is represented in FIG. 1B.

The expression for the electric potential V(M) at the point M between the two plates is ultimately given by the expression:

$$V(M) = \frac{1}{2\pi\varepsilon_0}\left(\frac{q_1}{MS_1} + \frac{q_2}{MS_2} + \frac{q_3}{MS_3} + \frac{q_4}{MS_4}\right) \quad [17]$$

Figure 3B:
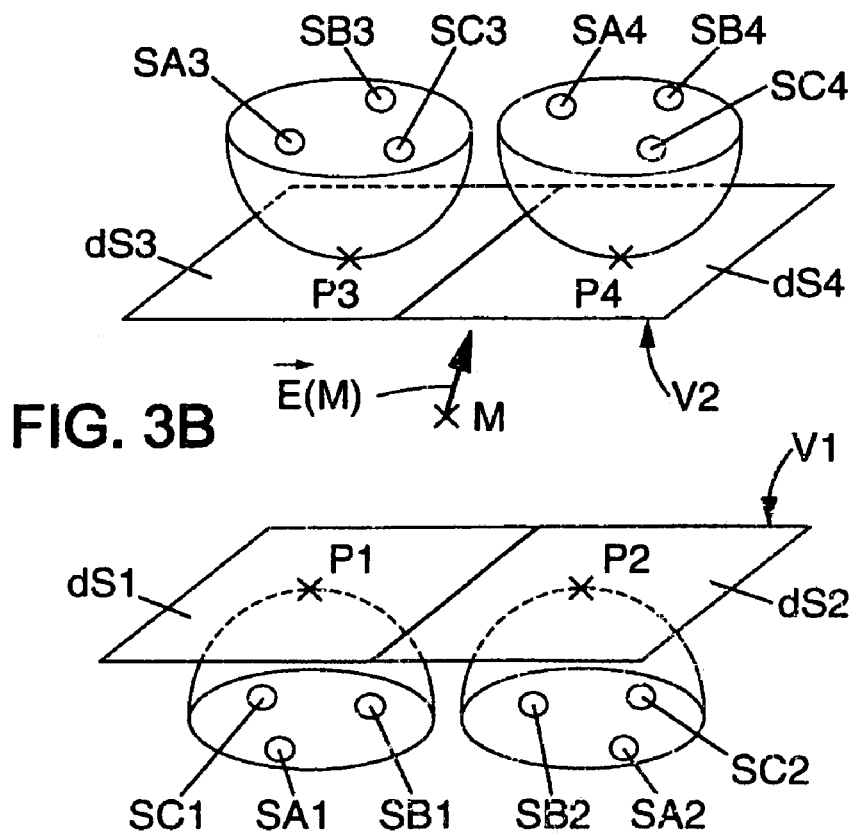
FIG. 3B represents, by way of illustration, the plates of a capacitor, of respective electric potentials V1 and V2, for the estimation of an electric field $\vec{E}(M)$, at the point M of three-dimensional space, three sources $SA_i$, $SB_i$ and $SC_i$ being associated with each surface sample $dS_i$ of FIG. 3B.

Reference is now made to FIG. 3B in which the same plates have been represented as in FIG. 3A, with substantially the same mesh, but with the aim, here, of estimating a vector quantity corresponding to the electric field $\overrightarrow{E(M)}$, at the point M of three-dimensional space.

Relations [11] to [15] can be applied to estimate the value of the electric field at the point M, with, in relation [13]:

$$C_\sigma^\mu(i,j) = \left(\frac{1}{2\pi\varepsilon_0 d^2(P_i, S\sigma_j)}\right)_u \quad [18]$$

with
- σ=A, B, C
- u=x, y, z
- i=1, 2, 3, 4
- j=1, 2, 3, 4.

However, the values of the electric field at the point of contact $P_i$ remain to be determined in relation [11].

A predetermined general law for the behavior of the field (in reflection, in transmission or other) at the level of the surface of the obstacle (plates in the example of the aforesaid capacitor) is then introduced to ascertain the values of the sources $v\sigma_j$.

For example, if the electric wave is reflected totally by the surface of an obstacle (for example one of the two plates), the electric field at a point of contact $P_i$ is normal to the surface $dS_i$ and its components $E_x$ and $E_y$ are zero. By way of illustration, if the surface of the plate was represented only by a single surface sample with three sources, the values of its sources vA, vB and vC would all be mutually equal to one and the same value +q.

On the other hand, if the coefficient of reflection is practically zero at the surface $dS_i$, the component of the electric field $E_z$ at the point $P_i$ is zero, this corresponding indeed to the case where the field is substantially tangential to the surface $dS_i$. Thus, by way of illustration, if the surface of the plate was represented only by a single surface sample with three sources, the values of its sources vA, vB and vC would be, for example, +q, +q and −2q respectively. For example, within the framework of the propagation of a magnetic wave, if the surface of an eddy current sensor (with a zero normal component of the magnetic field) was represented by a single surface sample, the magnetic fluxes of the three sources associated with this surface sample would be +φ, +φ and −2φ.

It is thus understood that with the three sources per sample $dS_i$, it is possible to define, for example as a function of the weighting of each source, any orientation of the field at the surface of the obstacle.

Of course, this approach assumes that the coefficient of reflection R of an obstacle is known beforehand. In particular, it may be advantageous to compare a simulation and an experimental measurement so as to detect, at the surface of an obstacle, inhomogeneities or impurities which correspond to points of the surface of this obstacle which do not satisfy the values of the coefficient of reflection R that are prescribed at each predetermined point $P_i$ of the obstacle.

A predetermined value of the reflection coefficient can thus be assigned to each point $P_i$ of the surface of the obstacle. Accordingly, a matrix R which is representative of the reflection coefficient at each point $P_i$ is introduced. For an interaction between a radiating element and an obstacle, it is thus possible to express the matrix system of relation [9] in another way, that is to say by giving a single expression for all the sources of the system (both of the obstacle and of the radiating element), as indicated hereinbelow.

In what follows, it is indicated that:
- F(P) is the interaction matrix of the obstacle OBS, applied to the points $P_i$ of the surface of the obstacle OBS;
- F(P') is the interaction matrix of the obstacle OBS, applied to the points $P'_i$ of the surface of the radiating element ER;
- F'(P) corresponds to the interaction matrix of the radiating element ER, applied to the points $P_i$ of the surface of the obstacle OBS;
- F'(P') corresponds to the interaction matrix of the radiating element ER, applied to the points $P_i$ of the surface of the radiating element ER;
- $\vec{v}'$ corresponds to the column vector comprising the values of the sources $S'_i$ of the radiating element ER; and
- $\vec{v}$ corresponds to the column vector comprising the values of the sources $S_i$ of the obstacle OBS.

On an obstacle, the contribution of the wave emitted by the radiating element ER is expressed by:

$$\vec{V}'(P) = F'(P) \cdot \vec{v}' \quad [19]$$

The contribution of the secondary wave returned by the obstacle OBS is expressed, by definition, by the relation:

$$\vec{V}(P) = F(P) \cdot \vec{v} \quad [20]$$

Now, in the example represented in FIG. 4A, the secondary wave corresponds simply to a reflection of the main wave. This is expressed by the relation:

$$\vec{V}(P) = R\vec{V}'(P) \quad [21]$$

where R corresponds to a reflection matrix each coefficient of which represents the contribution to the emission, by reflection, of the secondary wave, by each source $S_i$ (or $S\sigma_i$, within the framework of estimation of a vector quantity) of the obstacle OBS.

From the three relations [19], [20] and [21] is deduced the expression for the column vector $\vec{v}$ comprising the values of the sources of the obstacle, on the basis of the column vector $\vec{v}$ comprising the values of the sources of the radiating element, through the relation:

$$\vec{v} = [F(P)]^{-1} \cdot R \cdot [F'(P)] \cdot \vec{v}' \quad [22]$$

Additionally, for fine estimation of the scalar or vector quantities at the point M, in particular to take account of multiple reflections, it is advantageous to take account of the contribution of the radiation by the obstacle, at the level of the surface of the radiating element ER. Accordingly, account is taken, in the estimation of the boundary conditions at the surface of the radiating element ER (at the points $P'_i$) of the contribution of the radiation of the sources $S'_i$ of the radiating element and of the contribution of the emission of the secondary wave by the sources $S_i$ of the obstacle, through the relation:

$$\vec{V}_T(P') = F(P') \vec{v} + F'(P') \vec{v}' \quad [23]$$

The source values $S'_i$ of the radiating element ER can thus be tailored, by virtue of relation [23], by taking account of the reflection of the obstacle OBS, according to the following relation:

$$\vec{V}_T(P') = \{F(P') \cdot [F(P)]^{-1} \cdot R \cdot [F'(P)] + F'(P')\} \cdot \vec{v}' \quad [10]$$

Thus, boundary conditions are simply prescribed for the radiating element, so as to deduce therefrom the values of the sources $v'_i$. In practice, one will preferably proceed as follows:
- after meshing the surfaces, one determines the position of the points $P_i$ and $P'_i$ and of the sources $S_i$ and $S'_i$;

as a function of the type of wave involved, one determines the coefficients of the matrices F(P), F'(P), F(P') and F'(P');

as a function of a law of reflection of the obstacle, one determines the coefficients of the reflection matrix as in the example given later in respect of an ultrasound wave;

as a function of boundary conditions on the radiating element (the behavior of which is generally known for a given problem), one determines the values of the vector $\vec{V}_T(P')$ at the points $P'_i$ of the surface of the radiating element and one deduces therefrom the values of the sources $S'_i$ of the radiating element by inverting relation [10];

one also deduces therefrom the values of the sources $S_i$ of the obstacle by applying relation [22];

once the values of all the sources $S_i$ and $S'_i$ have been determined, one can apply the matrix system given by relation [9] to any point M of space, by applying the interaction matrices F and F' (involving the position of the point M and the positions of the respective sources $S_i$ and $S'_i$) to this point M.

Referring again to FIG. 4A, it is considered that the obstacle OBS represents simply an interface between two media M1 and M2, thus forming a dioptric member which may be plane, such as represented in the example in FIG. 4A, but also curved or of any general shape. The reflection coefficients $R_i$ associated with each point $P_i$ depend, within the framework of the propagation of an ultrasound or electromagnetic wave of high frequency, on the angle of incidence $\beta_i$ of the ray emanating from the source $S_i$, at the point of three-dimensional space M.

For an ultrasound wave, the expression for the coefficients of reflection $R_i$ is given by:

$$R_i = \frac{\rho_2 c_2 \cos\beta_i - \rho_1 c_1 \left[1 - \frac{c_2^2}{c_1^2} + \frac{c_2^2}{c_1^2}\cos^2\beta_i\right]^{1/2}}{\rho_2 c_2 \cos\beta_i + \rho_1 c_1 \left[1 - \frac{c_2^2}{c_1^2} + \frac{c_2^2}{c_1^2}\cos^2\beta_i\right]^{1/2}} \quad [24]$$

where:

$c_1$ is the speed of sound in medium $M_1$;
$c_2$ is the speed of sound in medium $M_2$;
$\rho_1$ is the density of medium $M_1$;
$\rho_2$ is the density of medium $M_2$.

In this expression [24], the term $\cos \beta_i$ may simply be estimated as a function of the coordinates in space of the point M and of the point representing the source $S_i$.

Figure 4B:
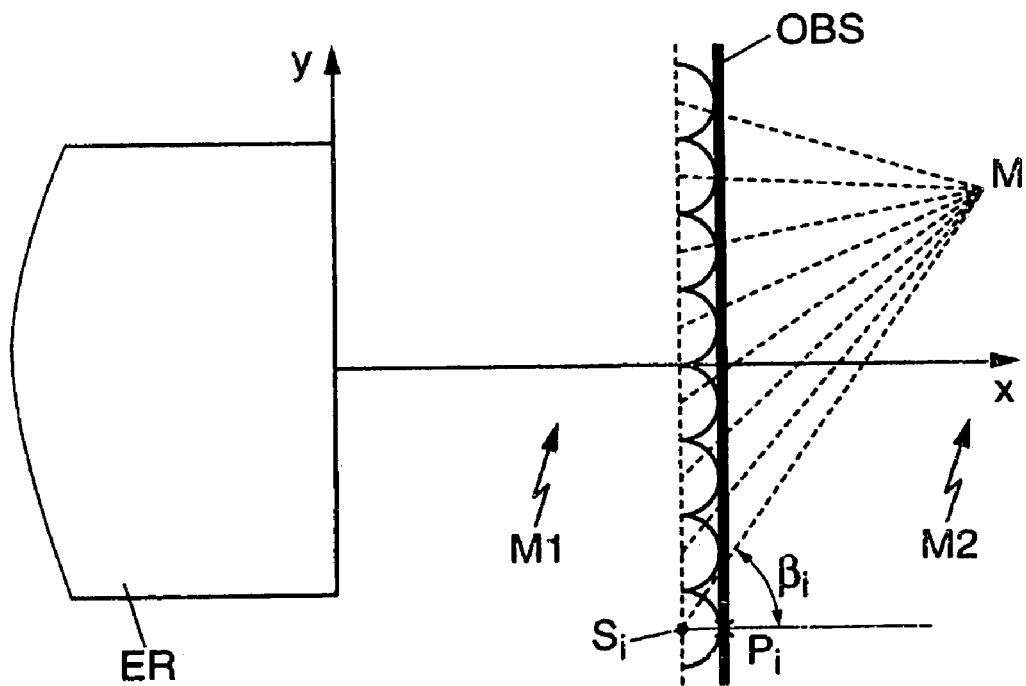
FIG. 4B, complementary to FIG. 4A, represents a transmission by the obstacle OBS of the wave emitted by the radiating element ER, at a point M of a half-space delimited by the plane formed by the surface of the obstacle OBS.

Referring now to FIG. 4B, the same estimation may be undertaken for a point M situated in the medium $M_2$. In this case, the wave that the point M receives is a wave transmitted by the obstacle OBS. In particular, it is noted that the sources of the radiating element ER are no longer active, owing to the occultation of the radiating element ER by the obstacle OBS. In transmission, the reasoning applies as above with a boundary condition prescribed at the points $P_i$ through the values of the transmission coefficients $T_i$ associated with each point $P_i$. Within the framework of the propagation of an ultrasound wave, each transmission coefficient $T_i$ is given by the relation:

$$T_i = \frac{2\rho_2 c_2 \cos\beta_i}{\rho_2 c_2 \cos\beta_i - \rho_1 c_1 \left[1 - \frac{c_2^2}{c_1^2} + \frac{c_2^2}{c_1^2}\cos^2\beta_i\right]^{1/2}} \quad [25]$$

As indicated above, the terms $\cos \beta_i$ may be determined as a function of the respective coordinates of the sources $S_i$ and of the point M.

To estimate the values of sources $S_i$ of the obstacle OBS, relation [22] is applied while replacing, however, the reflection matrix R by the transmission matrix T:

$$\vec{v} = [F(P)]^{-1} T [F'(P)] \vec{v}' \quad [26]$$

Within the framework of the propagation of an ultrasound wave, the coefficients of the matrices R and T are estimated for each source $S_i$ and for each point $P_i$. In particular, each coefficient $T_{i,j}$ or $R_{i,j}$ of the matrix T or of the matrix R (where i corresponds to the $i^{th}$ row and j corresponds to the $j^{th}$ column) is expressed as a function of an angle $\beta_{i,j}$ between a normal to the surface of the obstacle at the point $P_i$ and a straight line passing through the point $P_i$ and through a source $S_j$. It is thus possible to write, in a general manner, the two relations expressing the values of the coefficients of the matrices T and R by the following respective relations:

$$T_{i,j} = f_t(\cos \beta_{ij}) \quad [27]$$

$$R_{i,j} = f_r(\cos \beta_{ij}) \quad [28]$$

where $f_t$ is given by relation [25] and $f_r$ is given by relation [24].

More generally, with reference to FIGS. 4A and 4B, it is indicated that, if the obstacle is considered to be a solid material representing a medium M2 distinct from a medium M1 in which the main wave propagated initially:

for a reflection of the main wave off the obstacle in the guise of medium M2 (the surface of the obstacle forming a dioptric member between the media M1 and M2), the hemispheres $HEM_i$ are oriented outwards from the obstacle (FIG. 4A);

for a transmission of the main wave within the obstacle, the hemispheres $HEM_i$ are oriented inwards into the obstacle (FIG. 4B).

Figure 5A:
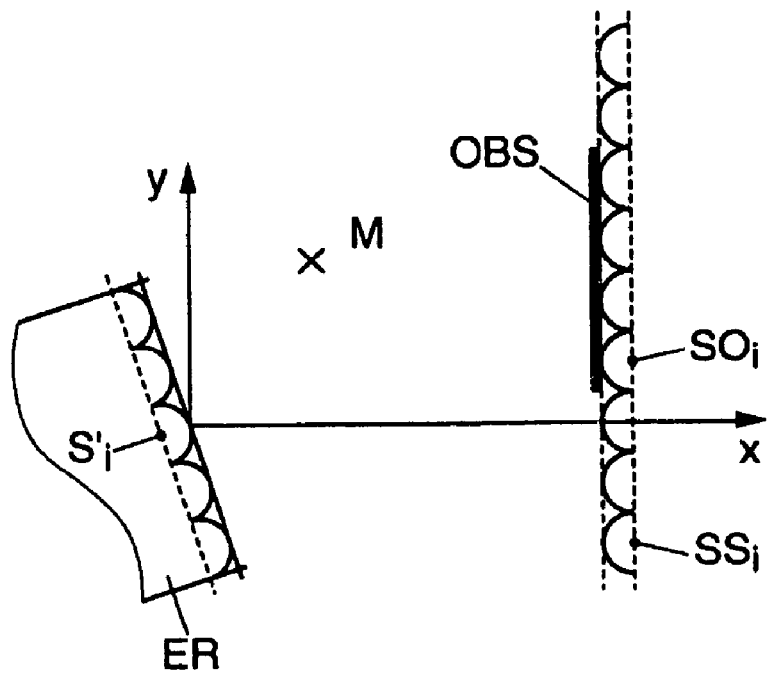
FIG. 5A diagrammatically represents an obstacle OBS, of finite dimensions, with sources associated with the surface samples and arranged so as to estimate a quantity representative of a reflection of the wave off the obstacle.

Reference is now made to FIG. 5A to describe the case of a plane obstacle OBS of finite dimensions, excited by a radiating element ER, inclined by a predetermined angle with respect to the obstacle OBS. As indicated above, for an ultrasound wave, the inclination of the radiating element will be taken into account to compute the contribution of the wave emitted by the radiating element at the point M. Additionally, in a particularly advantageous manner, a surface which encompasses the surface of the obstacle is meshed (FIG. 5A). For a slice of space that is delimited by the radiating element, on the one hand, and the obstacle, on the other hand (FIG. 5A), three types of sources can be considered:

the sources $S'_i$ of the radiating element ER, sources $SO_i$, which return the secondary wave, by reflection from the obstacle OBS, as a function of a certain coefficient of reflection R of the obstacle; and sources $SS_i$, which do not return any secondary wave and to which a zero coefficient of reflection may be allocated if the obstacle separates two media of identical indices. In this case, these sources $SS_i$ are considered to be "off" in the aforesaid slice of space and are not taken into account in the computations of the physical quantity at the point M of FIG. 5A. On the other hand, these sources $SS_i$ may be active through reflection of the main wave if the obstacle OBS separates two media of different indices.

Additionally, to estimate the scalar or vector quantities associated with a point M of a half-space delimited by the surface encompassing the obstacle OBS (on the right of FIG. 5B), one considers:

the sources $SO'_i$ of the obstacle, which are active through transmission of the main wave, and the sources $SS_i$, to which one now assigns a coefficient of transmission equal to 1 if the obstacle separates two media of like indices. These sources $SS_i$ behave ultimately (to within angles of incidence) like the sources $S'_i$ of the radiating element ER.

The sources $S'_i$ of the radiating element may then be "off" for the computation of the physical quantities in this half-space.

To compute the values $\vec{v}'$ of the sources $S'_i$ of the radiating element (from which are deduced the values $\vec{v}$ of the sources of the obstacle according to relations [22] and [26]), boundary conditions will simply be applied to the points of the active surface of the radiating element ER. For example, for ultrasound wave propagation, it may be indicated that the sound velocities at the points of the surface of the radiating element ER are perpendicular to this surface and have mutually equal moduli $v_0$.

Generally, it is indicated that the three-dimensional space may thus be divided up by interfaces delimiting media of distinct properties, each interface representing an obstacle within the meaning of the present invention. The physical quantities are then computed in each slice of space. For example, within the framework of the study of a heterostructure (for several interfaces), the above method may be applied in respect of successive slices of space by considering two interfaces: one representing a "radiating element", within the meaning of FIGS. 4A and 5A, for example through transmission of a received wave, and the other representing an obstacle receiving the transmitted wave. Advantageously, account is taken, for each slice of space, of the contributions of all the interfaces, as expressed by relations [10] and [22].

However, in a preferred practical embodiment, in particular in order to programme the simulation of an interaction, one will advantageously consider all the obstacles of the entire space around a point M and a condition will be prescribed regarding the position of the point M with respect to each source present in the space.

Figure 7A:
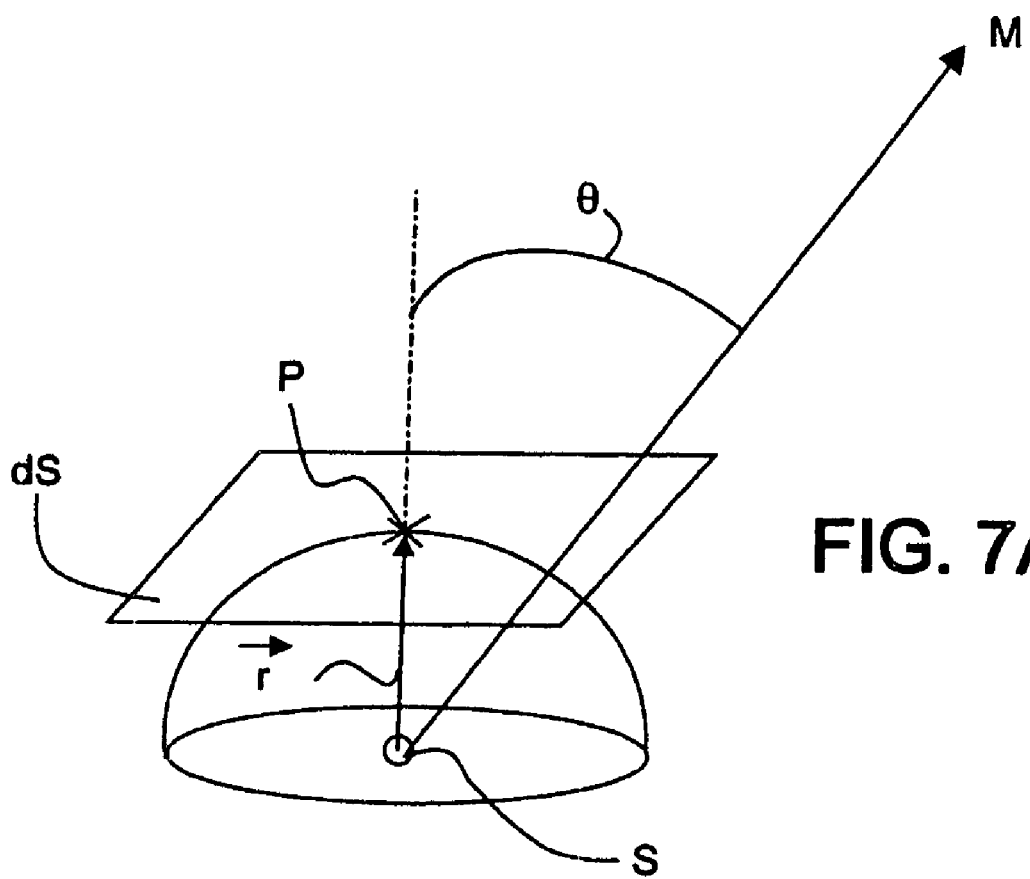
FIG. 7A represents in detail a surface element and an observation point M whose relative positions are labelled by an angle θ.

Preferably, with reference to FIG. 7A, the scalar product $\overrightarrow{SM} \cdot \vec{r}$ is tested at each iteration with respect to a source S, for example in the form:

$$\frac{\overrightarrow{SM} \cdot \vec{r}}{\|\vec{r}\| \cdot \|\overrightarrow{SM}\|} = \cos\theta$$

where $\vec{r}$ is the vector connecting the source S to the point of contact P of the half-sphere with the surface element dS considered, in the case where just one source per hemisphere is envisaged. In the case where a triplet of sources S1, S2, S3 is in fact envisaged, the base of the vector $\vec{r}$ is preferably situated at the barycentre of the three sources S1, S2, S3.

Moreover, in the case of three sources per surface sample, the computation of the scalar product concerns each source $S_i$ of the triplet S1, S2, S3.

Typically, if $\cos \theta$ is positive, one takes into account the contribution of this source S in the estimation of the interaction.

On the other hand, if $\cos \theta$ is negative, a zero (scalar or vector) value is assigned to this source S in the estimation of the interaction.

As a variant of the computation of the scalar product above, an "altitude" of the point M can be computed. In this case, the test pertains to a quantity of the type:

$$\frac{\overrightarrow{SM} \cdot \vec{r}}{\|\vec{r}\|}$$

Of course, other types of test are possible. For example, in the case of a computation with respect to the angle $\theta$, this angle can be chosen within a cone of chosen aperture, or otherwise.

Ultimately, this approach advantageously makes it possible to systematize any configuration of the sources with respect to the observation point M, by simply introducing an extra step for testing, at each iteration on a source S, the position of this source S with respect to the point M, as indicated above.

Figure 7B:
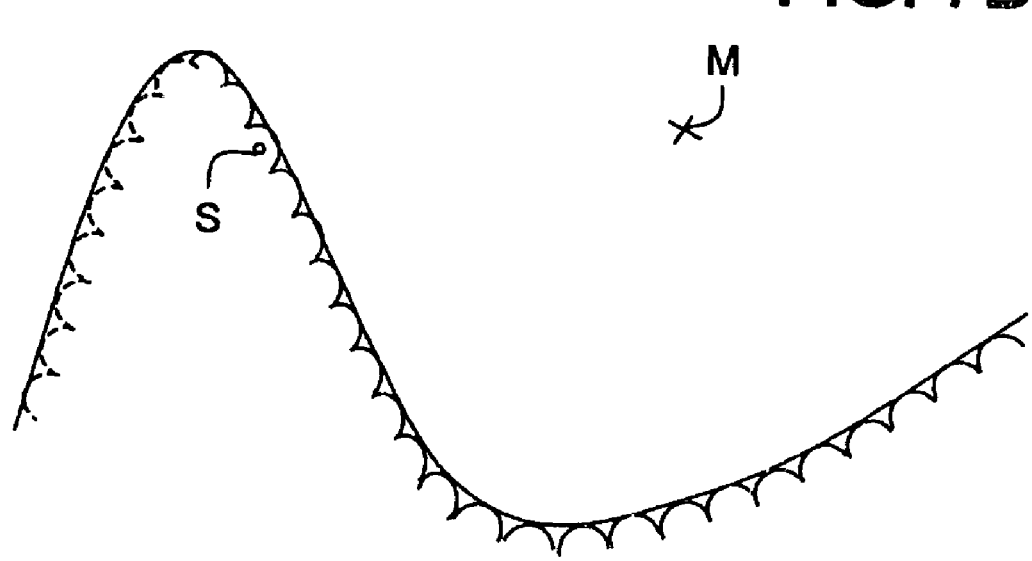
FIG. 7B diagrammatically represents a surface to be meshed of complex shape, in particular with an observation point M lying in a shadow zone with respect to certain sources of the surface.

This approach proves to be particularly advantageous for surfaces to be meshed which are relatively complex, in particular when the observation point M is liable to be situated in a shadow zone with respect to certain sources, as shown in FIG. 7B. In this FIG. 7B, the half-spheres associated with the sources in the shadow zone of the observation point M and for which, consequently, the contribution is fixed as being zero in the estimated interaction have been represented by dashes. Of course, in the case where a source is screened by a sampled surface, although the scalar product $\overrightarrow{SM} \cdot \vec{r}$ associated with this source remains positive, a second test determines whether the vector $\overrightarrow{SM}$ does or not does cross a sampled surface. If it does, this source is considered to be inactive specifically for the region of the point M.

Thus, in more general terms, the method within the meaning of the invention preferably envisages at least one extra step, for each surface sample, for testing the value of a scalar product of:

a first vector $\vec{r}$ normal to the surface sample and directed towards the apex P of the hemisphere, such as represented in FIG. 7A, and a second vector $\overrightarrow{SM}$ drawn between a source S associated with this hemisphere and the point M which is situated in the region of observation, while distinguishing, in particular:

the case where this scalar product is less than a predetermined threshold and the contribution of this source is not taken into account, and the case where this scalar product is greater than a predetermined threshold and the contribution of this source is actually taken into account.

In the example above where the angle $\theta$ between these two vectors is considered, the aforesaid predetermined threshold is of course the value zero and one simply distinguishes between the cases where the scalar product is positive or negative.

Of course, this choice is not limiting so that, for a heterostructure with several parallel dioptric members, it will again be possible to consider, advantageously, successive half-spaces, as described above with reference to FIGS. 4A and 4B.

Figure 5B:
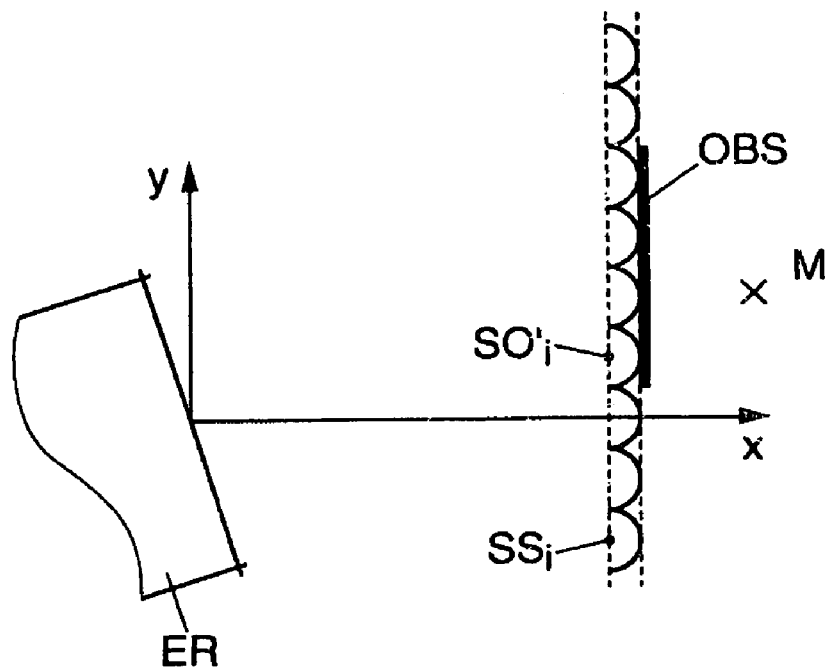
FIG. 5B, as a supplement to FIG. 5A, diagrammatically represents an obstacle OBS, of finite dimensions, with the sources associated with the surface samples and placed so as to estimate a quantity representative of the transmission of the wave by the obstacle.
Figure 5C:
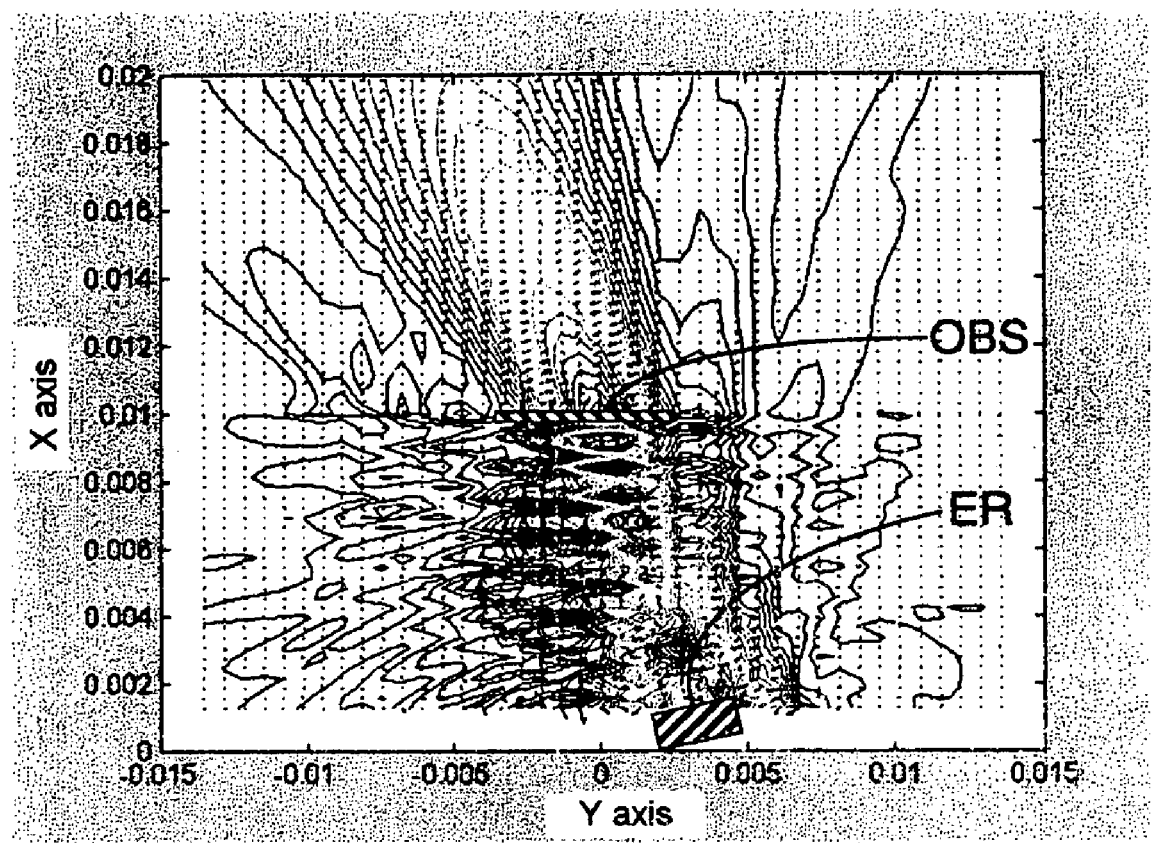
FIG. 5C represents a simulation of an ultrasound wave emitted by a radiating element ER and propagating towards an obstacle OBS.
Figure 6:
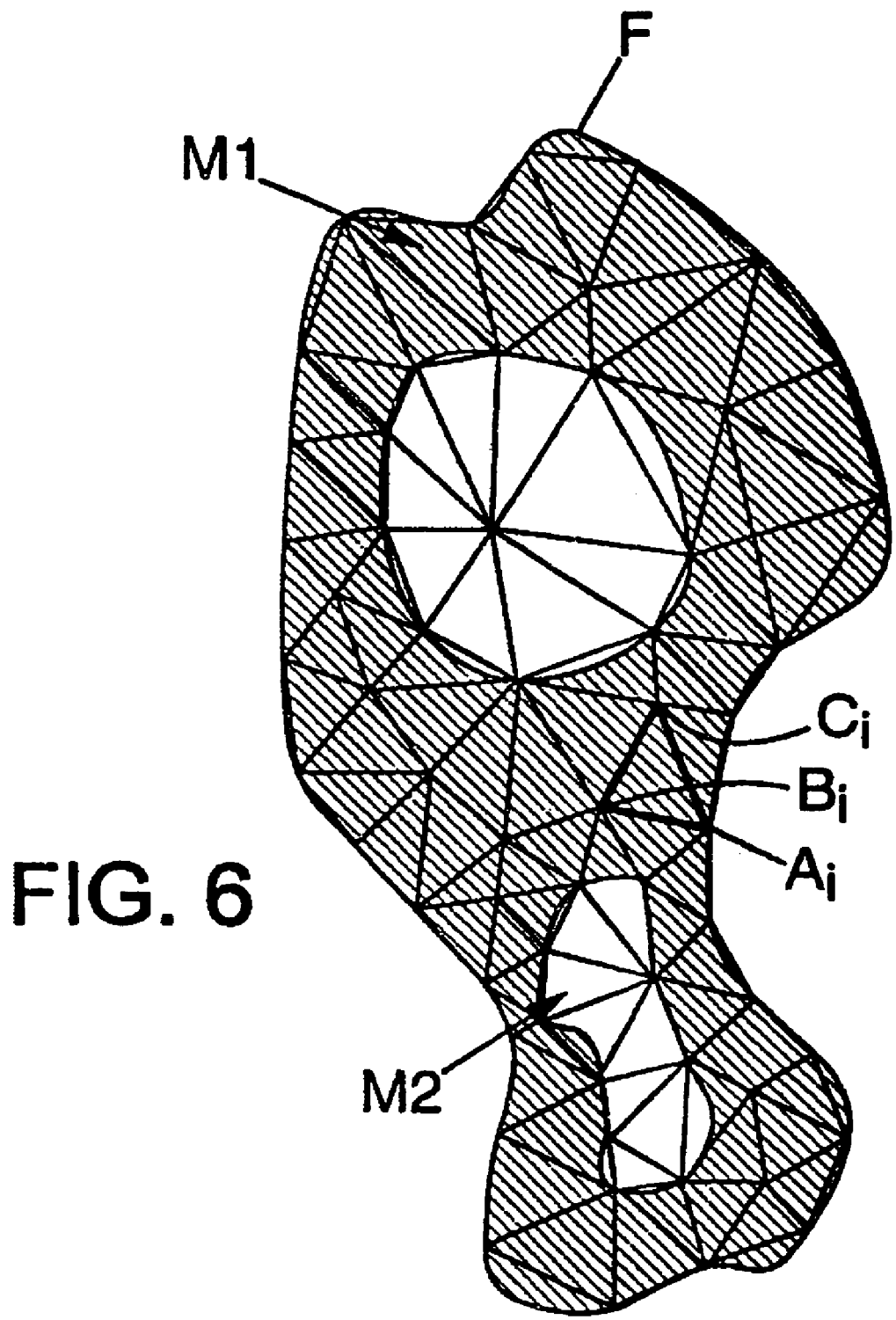
FIG. 6 represents a mesh of three-dimensional media, for the application of a method of computation by "finite elements", within the meaning of the state of the art.

The simulation of FIG. 5C corresponds, for an ultrasound wave, to the situation of FIGS. 5A and 5B by taking account:
- of the contribution of the emission of the main wave by the radiating element ER;
- of the contribution of the reflection of this main wave by the obstacle; and
- of the contribution of the transmission of the main wave by the obstacle.

The level lines of FIG. 5C correspond to various magnitudes of acoustic pressure. The radiating element ER is placed 10 mm from the obstacle OBS and inclined by 20° with respect to the latter. Interference fringes are noted in particular in a zone between the obstacle OBS and the radiating element ER. Such a simulation may advantageously indicate an ideal position of an ultrasound sensor. These ultrasound sensors customarily comprise a transducer as active radiating element and a detector for measuring the ultrasound waves received. The simulation of FIG. 5C may thus moreover indicate the ideal shape of an ultrasound sensor, depending on the desired applications, for a given shape of obstacle.

The simulation of FIG. 5C has been performed by virtue of a matrix computation programmed with the aid of the MATLAB© computation software. The chosen total number of mesh cells for the obstacle and for the radiating element (here, a few hundred in all) is then optimized:
- on the one hand, to limit the duration of the computations; and
- on the other hand, so that the size of the mesh cells remains less than half a wavelength, so as to satisfy the Rayleigh criterion.

It is indicated however that, as the elements to be meshed in the implementation of the method according to the invention are simply surfaces, the computation times are not nearly as long as those required in the implementation of a method of computation of "finite element" type.

The present invention can thus be realized by the implementation of a succession of instructions of a computer program product stored in the memory of a hard disk or on a removable support and running as follows:
- choice of a meshing stepsize in particular as a function of the wavelength of the main wave;
- determination of the coordinates of the sources $S_i$ and/or $S'_i$ and of the points of contact $P_i$ and/or $P'_i$;
- choice of a type of wave involved and computation of the coefficients of the interaction matrices applied to the points $P_i$ and/or $P'_i$ through the implementation of matrix computation software;
- choice of a law of reflection and/or of transmission of the surface of the obstacle and computation of the coefficients of the reflection and/or transmission matrices;
- computation of the values of the sources $S_i$ and/or $S'_i$; and
- computation of the scalar or vector quantities at every point of three-dimensional space.

In this regard, the present invention is also aimed at such a computer program product, stored in a central unit memory or on a removable support able to cooperate with a reader of this central unit, and comprising in particular instructions for implementing the method according to the invention.

Of course, the present invention is not limited to the embodiment described hereinabove by way of example; it extends to other variants.

Thus, it will be understood that, even if, in the figures discussed above, both the surface of an obstacle and the surface of a radiating element are represented, the present invention applies also to the estimation of physical quantities within the framework of a wave interacting with an obstacle and emitted in the far field. In this context, it is not necessary to demarcate the surface of a radiating element to be meshed and relations [8] and [14] above suffice to determine the interaction between this wave and the obstacle.

Equations making it possible to compute the scalar or vector quantities at a point M of space, for electromagnetic waves, or acoustic waves, have been indicated above. Of course, these quantities may be estimated for other types of waves, in particular for thermal waves, electromagnetic waves involving radiofrequency antennas, or others.

Of course, the present invention is not limited to an application to nondestructive testing, but to any type of application, in particular in medical imaging, for example for the study of microsystems employing acoustic microscopy with movable mirrors.

Interactions between a wave and a single obstacle have been described above. Of course, the present invention applies to an interaction with several obstacles. Accordingly, it is simply necessary to mesh the surfaces of these obstacles and to add up their contribution for the estimation of a vector or scalar quantity at any point of space. Likewise, as indicated above, the surface of the obstacle OBS may be plane, or else curved, or else of any complex shape.

Thus, within the framework of a wave interacting with several obstacles in space, a simulation equivalent to that represented in FIG. 5C would make it possible to position sensors and/or radiating elements as a function of the configuration of these obstacles, in particular for an application to the determination of the position of loudspeakers in a partitioned cabin, such as a motor vehicle cabin.

The three-dimensional space may be divided up into a plurality of regions, as described above with reference to FIGS. 4A, 4B, 5A and 5B. However, in order for a surface of one of the said regions to be considered to be an obstacle of a main wave, the said obstacle becoming active by emission of a secondary wave, the angle of incidence of the main wave on this surface must preferably remain less than or equal to 90°.

The invention claimed is:

1. A method, performed by a processor in connection with a memory of a central unit, of evaluating a physical quantity associated with an interaction between a wave and an obstacle in a region of three-dimensional space, the method comprising:

a) meshing a surface into a plurality of surface samples, wherein at least a part of said plurality of samples represents a surface of an obstacle that receives a main wave and emits, in response to the main wave, a secondary wave, and allocating to each surface sample at least one source emitting an elementary wave representing a contribution to said secondary wave, b) using a matrix system comprising:
an invertible interaction matrix applicable to a given region of space and comprising a number of columns corresponding to a total number of sources, the interaction matrix being stored in a first part of the memory of the central unit,
a first column matrix being stored in a second part of the memory of the central unit, each coefficient of said first column matrix being associated with one source and characterizing the elementary wave that said one source emits, and a second column matrix, obtainable by multiplication, by the processor, of the first column matrix by the interaction matrix, and being stored in a third part of the memory of the central unit, each coefficient of said second column matrix being values of a physical quantity representative of the wave emitted by all of the sources of said given region, wherein the physical quantity is a quantity of the set of quantities including an electrostatic potential an electromagetic potential and an acoustic pressure, and using the matrix system a first time for:

c) assigning chosen values of said physical quantity to predetermined points, each of said predetermined points being associated with a surface sample, placing said chosen values in the second column matrix, applying the interaction matrix to said predetermined points, and estimating the coefficients of said first column matrix by multiplication of said second column matrix by the inverse of the interaction matrix determined for said predetermined points; and using the matrix system at least a second time for:

d) applying the interaction matrix to a chosen region of three-dimensional space, multiplying the first column matrix comprising the coefficients estimated in step c) by said interaction matrix determined for said chosen region, to evaluate coefficients of said second column matrix so that the coefficients are used to determine any one of an impurity on the surface of the obstacle, an optimum position of a sensor for determining a characteristic of the obstacle, and to display a map of a region of three dimensional space indicating the value of the physical quantity at a plurality of locations of the three dimensional space;

wherein the coefficients of said second column matrix, evaluated in step d), corresponding to values of said physical quantity representing the secondary wave emitted by the obstacle, in said region of three-dimensional space, each of said predetermined points associated with a surface sample corresponding to a point of contact between said surface sample and a hemisphere, said hemisphere:

having a surface equal to the surface of said surface sample, and including said at least one source allocated to said surface sample, wherein:

the surface of the obstacle corresponds to an interface between a first medium and a second medium, said main wave propagating in said first medium, and said hemisphere is oriented:

inwardly for a propagation of said secondary wave in said second medium, and outwardly for a propagation of said secondary wave in said first medium.

2. The method according to claim 1, further comprising in step a), meshing a plurality of surface samples representing an active surface of element radiating the main wave, and allocating at least one source emitting an elementary wave representing a contribution to said main wave to each sample of the active surface, steps b), c) and d) are furthermore applied to the samples of the active surface, and wherein said physical quantity representing the interaction between the radiating element and the obstacle in a given region of three-dimensional space is evaluated by taking account of the contribution, in said chosen region, of the main wave emitted by the sources of the active surface and the contribution of the secondary wave emitted by the sources of the surface of the obstacles.

3. The method according to claim 2, wherein the secondary wave corresponds to a reflection of the main wave on the obstacle, the hemisphere is oriented outwards from the obstacle, and to estimate the contribution of the secondary wave in said given region in step d), said values of physical quantity chosen in step c) are dependent on a predetermined coefficient of reflection of the main wave by each surface sample of the obstacle, and further wherein the values associated with the sources of the radiating element are determined and, in said matrix system, are formed at least:

a first interaction matrix representing the contribution of the sources of the obstacle to the predetermined points of the surface of the obstacle, a second interaction matrix representing the contribution of the sources of the radiating element to the predetermined points of the surface of the obstacle, a reflection matrix, comprising coefficients representing coefficients of reflection at each predetermined point of the obstacle, to determine the values of the sources of the obstacle as a function of the values of the sources of the radiating element and of a multiplication of the first and second interaction matrices and of the reflection matrix.

4. The method according to claim 2, wherein, the secondary wave corresponds to a reflection of the main wave in the obstacle, the hemisphere is oriented inwards into the obstacle, and to estimate the contribution of the secondary wave in said chosen region in step d), said values of physical quantity chosen in step c) are dependent on a predetermined coefficient of transmission of the main wave by each surface sample of the obstacle, and further wherein in step c), the values associated with the sources of the radiating element are determined and, in said matrix system, are formed at least:

a first interaction matrix representing the contribution of the sources of the obstacle to the predetermined points of the surface of the obstacle, a second interaction matrix representing the contribution of the sources of the radiating element to the predetermined points of the surface of the obstacle, a transmission matrix comprising coefficients representing coefficients of transmission at each predetermined point of the obstacle, to determine the values of the sources of the obstacle as a function of the values of the sources of the radiating element and of a multiplication of the first and second interaction matrices and of the transmission matrix.

5. The method according to claim 2, wherein, in step c), the values associated with the sources of the radiating element are determined by taking account of the reception of the secondary wave by the radiating element and by furthermore formulating:

a third interaction matrix representing the contribution of the sources of the obstacle to the predetermined points of the surface of the radiating element, and a fourth interaction matrix representing the contribution of the sources of the radiating element to the predetermined points of the surface of the radiating element.

6. The method according to claim 2, wherein the radiating element is a sensor, for nondestructive testing, intended for analysing an object forming an obstacle of the main wave.

7. The method according to claim 1, wherein each coefficient of the interaction matrix, applied to a given region of space, is representative of an interaction between a source and said given region and the value of each coefficient is dependent on a distance between a source and said given region.

8. The method according to claim 1, wherein the interaction matrix applied, in step c), to said predetermined points comprises a number of rows corresponding to a total number of predetermined points.

9. The method according to claim 1, wherein the physical quantity to be evaluated is a scalar quantity and, in step a), a single source is allocated to each surface sample.

10. The method according to claim 9, wherein the interaction matrix applied, in step d), to the chosen region of space comprises a single row.

11. The method according to claim 9, wherein each predetermined point associated with a surface sample corresponds to a point of contact between the surface sample and a hemisphere having:
 a surface equal to the surface of said surface sample, and
 a centre corresponding to a position of the source allocated to said surface sample.

12. The method according to claim 11, wherein, for each surface sample, the value of a scalar product is tested of:
 a first vector normal to the surface sample and directed towards the apex of the hemisphere, and
 a second vector drawn between a source associated with this hemisphere and said given region,
 while distinguishing:
 the case where this scalar product is less than a predetermined threshold and the contribution of this source is not taken into account, and
 the case where this scalar product is greater than a predetermined threshold and the contribution of this source is actually taken into account.

13. The method according to claim 9, wherein:
 the main wave is an electric wave,
 the coefficients of the first column matrix are values of electric charge, each of said values being associated with a source, and
 the coefficients of the second column matrix are values of electric potential.

14. The method according to claim 9, wherein:
 the main wave is a magnetic wave,
 the coefficients of the first column matrix are values of magnetic flux, each of said values being associated with a source, and
 the coefficients of the second column matrix are values of magnetic potential.

15. The method according to claim 9, wherein:
 the main wave is a sound wave,
 the coefficients of the first column matrix are values of speed of sound, each of said values associated with a source, and
 the coefficients of the second column matrix are values of acoustic pressure.

16. The method according to claim 1, wherein the physical quantity to be evaluated is a vector quantity expressed by three coordinates in three-dimensional space, and three sources are allocated, in step a), to each surface sample.

17. The method according to claim 16, wherein the interaction matrix applied, in step d), to a region of space comprises a row for each space coordinate.

18. The method according to claim 16, wherein:
 the three sources allocated to each surface sample are substantially in the same plane, and
 each predetermined point associated with a surface sample corresponds to a point of contact between this sample and a hemisphere having
 a surface equal to the surface of said sample, and
 a centre corresponding to the position of a barycentre of said three sources.

19. The method according to claim 18, wherein the three sources of each same surface sample form substantially an equilateral triangle, and the triangles of the surface samples are oriented substantially randomly with respect to one another.

20. The method according to claim 16, wherein:
 the main wave is an electric wave,
 the coefficients of the first column matrix are values of electric charge, each value being associated with a source, and
 the coefficients of the second column matrix are values of coordinates of an electric field.

21. The method according to claim 16, wherein:
 the main wave is a magnetic wave,
 the coefficients of the first column matrix are values of magnetic flux, each value being associated with a source, and
 the coefficients of the second column matrix are values of coordinates of a magnetic field.

22. The method according to claim 16, wherein:
 the main wave is a sound wave,
 the coefficients of the first column matrix are values of speed of sound, each value being associated with a source, and
 the coefficients of the second column matrix are values of coordinates of an acoustic velocity.

23. The method according to claim 1, wherein:
 the secondary wave corresponds to a reflection of the main wave on the obstacle,
 the hemisphere is oriented outwards from the obstacle, and
 to estimate the contribution of the secondary wave in said given region in step d), said values of physical quantity chosen in step c) are dependent on a predetermined coefficient of reflection of the main wave by each surface sample of the obstacle.

24. The method according to claim 1, wherein:
 the secondary wave corresponds to a reflection of the main wave in the obstacle,
 the hemisphere is oriented inwards into the obstacle, and
 to estimate the contribution of the secondary wave in said chosen region in step d), said values of physical quantity chosen in step c) are dependent on a predetermined coefficient of transmission of the main wave by each surface sample of the obstacle.

25. The method according claim 24, wherein the surface of the obstacle corresponds to an interface between two distinct media of a heterostructure.

26. The method according to claim 1, wherein the main wave is a sound wave and the coefficients of the interaction matrix are each dependent on an angle of incidence of an elementary wave emanating from a source in said given region.

27. The method according to claim 1, wherein the main wave is a sound wave and, in step a), a total number of surface samples is chosen substantially as a function of a wavelength of the sound wave so as to satisfy the Rayleigh criterion.

28. The method according to claim 1, wherein a plurality of values of the physical quantity estimated in step d), which are obtained for a plurality of regions of space, are compared so as to select a candidate region for the placement of a radiating element intended to interact with the obstacle.

29. A computer program product, stored in a central unit memory or on a removable support able to cooperate with a reader of this central unit, intended to be run by a processor of said central unit for evaluating a physical quantity associated with an interaction between a wave and an obstacle, in a chosen region of three-dimensional space, wherein the computer program product comprises instructions for:
a) meshing a surface into a plurality of surface samples, wherein at least a part of said plurality of samples represents a surface of an obstacle that receives a main wave and emits, in response to the main wave, a secondary wave, and allocating to each surface sample at least one source emitting an elementary wave representing a contribution to said secondary wave,
b) using a matrix system comprising:
an interaction matrix, applicable to a given region of space and comprising a number of columns corresponding to a total number of sources, the interaction matrix being stored in a first part of the memory of the central unit,
a first column matrix being stored in a second part of the memory of the central unit, each coefficient of said first column matrix being associated with one source and characterizing the elementary wave that said one source emits,
and a second column matrix being stored in a third part of the memory of the central unit, which is obtained by multiplication of the first column matrix by the interaction matrix, each coefficient of said second column matrix being values of a physical quantity representative of the wave emitted by all the sources in said given region, wherein the physical quantity is a quantity of the set of quantities including an electrostatic potential, an electromagnetic potential, and an acoustic pressure.
using the matrix system a first time for:
c) assigning chosen values of said physical quantity to predetermined points, each of said predetermined points being associated with a surface sample, placing said chosen values in the second column matrix, applying the interaction matrix to said predetermined points, and estimating the coefficients of said first column matrix by multiplication of said second column matrix by the inverse of the interaction matrix determined for said predetermined points;
and using the matrix system at least a second time for:
d) applying the interaction matrix to a chosen region of three-dimensional space,
multiplying the first column matrix comprising the coefficients estimated in step c) by said interaction matrix determined for said chosen region, to evaluate coefficients of said second column matrix, so that the coefficients are used to determine any one of an impurity on the surface of the obstacle, an optimum position of a sensor for determining a characteristic of the obstacle and to display a map of a region of three dimensional space indicating the value of the physical quantity at a plurality of locations of the three dimensional space;
e) the coefficients of said second column matrix, evaluated in step d), corresponding to values of said physical quantity representing the wave emitted by the obstacle in said chosen region of three-dimensional space, each of said predetermined points associated with a surface sample corresponding to a point of contact between said surface sample and a hemisphere, said hemisphere:
having a surface equal to the surface of said surface sample, and
including said at least one source allocated to said surface sample,
wherein:
the surface of the obstacle corresponds to an interface between a first medium where said main wave propagates, and a second medium,
and said hemisphere is oriented:
inwardly for a propagation of said secondary wave in said second medium, and
outwardly for a propagation of said secondary wave in said first medium.

* * * * *